United States Patent
Chen

(10) Patent No.: US 10,547,193 B1
(45) Date of Patent: Jan. 28, 2020

(54) BATTERY CHARGING CIRCUIT

(71) Applicant: ANPEC ELECTRONICS CORPORATION, Hsinchu (TW)

(72) Inventor: Chih-Ning Chen, Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/166,315

(22) Filed: Oct. 22, 2018

(30) Foreign Application Priority Data

Aug. 10, 2018 (TW) .............................. 107128008 A

(51) Int. Cl.
*H02J 7/00* (2006.01)
*G01R 31/3835* (2019.01)

(52) U.S. Cl.
CPC .......... *H02J 7/008* (2013.01); *G01R 31/3835* (2019.01)

(58) Field of Classification Search
CPC ........ H02J 7/0052; H02J 7/0068; H02J 7/007; H02J 7/0072; H02J 7/008; H02J 7/027; H02J 7/045; Y10T 307/406; Y10T 307/549; G01R 31/3835
See application file for complete search history.

(56) References Cited

U.S. PATENT DOCUMENTS

| | | | | |
|---|---|---|---|---|
| 2009/0058393 | A1* | 3/2009 | Huang | H02J 7/0052 323/316 |
| 2009/0224726 | A1* | 9/2009 | Arai | H02J 7/0072 320/163 |
| 2016/0087462 | A1* | 3/2016 | Kudo | H02J 7/0068 320/162 |
| 2017/0040818 | A1* | 2/2017 | Kong | H02J 7/0052 |
| 2018/0191170 | A1* | 7/2018 | Huang | H02J 7/0047 |

* cited by examiner

*Primary Examiner* — Nha T Nguyen
(74) *Attorney, Agent, or Firm* — Li &Cai Intellectual Property (USA) Office

(57) ABSTRACT

A battery charging circuit adjusts a voltage proportional relationship between a turned-on voltage of a charging transistor and a turned-on voltage of a first transistor according to a first voltage corresponding to a charging current and a second voltage corresponding to the charging current, so that a ratio between the charging current and a first current sensing the charging current is a constant value or close to a constant value.

10 Claims, 7 Drawing Sheets

BATTERY CHARGING CIRCUIT

CROSS-REFERENCE TO RELATED PATENT APPLICATION

This application claims the benefit of priority to Taiwan Patent Application No. 107128008, filed on Aug.10, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a battery charging circuit, and more particularly to a battery charging circuit for stabilizing a current value of a charging current while operating in a constant current charging mode.

BACKGROUND OF THE DISCLOSURE

Generally, a battery charging circuit operates in a constant current (CC) charging mode and a constant voltage (CV) mode. During a charging process, the battery charging circuit firstly charges a battery module in the CC charging mode until a battery voltage of the battery module reaches a certain level, then changes to CV charging mode to charge the battery module. Taking a lithium battery with a fully-charged voltage of 4.2 volts (V) as an example, the battery charging circuit first charges the lithium battery in a constant current charging mode. When the lithium battery is charged to 4.1V, the battery charging circuit will switch to the constant voltage charging mode to continue charging the battery voltage of the lithium battery to 4.2V. The above constant current charging mode is used to quickly charge the lithium battery. The constant voltage charging mode is used to avoid overcharging the lithium battery, thereby extending the life of the lithium battery.

FIG. 1 shows a schematic diagram of an existing battery charging circuit. As shown in FIG. 1, the existing battery charging circuit includes a charging transistor 12, a sensing transistor 14, and a current detector 16. The charging transistor 12 is coupled between a system terminal Vsys and a charging terminal Vbat. The system terminal Vsys has a system voltage generated by a power supply. The charging terminal Vbat has a battery voltage generated by the battery module BAT. Further, one end Al of the charging transistor 12 is coupled to the system terminal Vsys, and the other end A2of the charging transistor 12 is coupled to the charging terminal Vbat, and the control terminal A3 is controlled by the control signal Vg to generate a charging current Ich flowing through the charging transistor 12 according to the control signal Vg. The sensing transistor 14 is coupled between the system terminal Vsys and the current detector 16. Further, the sensing transistor 14 has one end B1coupled to the system terminal Vsys, the other end B2 coupled to the current detector 16, and the control end B3 controlled by the control signal Vg, to generate a sensing current Is flowing through the sensing transistor 14 according to the control signal Vg.

The current detector 16 is coupled between the sensing transistor 14, the charging terminal Vbat and the charging transistor 12, and configured to generate, according to the battery voltage, a sensing voltage Vs corresponding to the charging current Ich, and generate, according to the sensing voltage Vs and a reference voltage Vref, the control signal Vg, thereby controlling turned-on and turned-off states of the charging transistor 12 and the sensing transistor 14. Furthermore, the current detector 16 has a voltage level controller 16a, a sensing resistor 16b and an operational amplifier 16c. The voltage level controller 16a is coupled between the sensing transistor 14 and the sensing resistor 16b, so as to make the end A2 of the charging transistor 12 and the end B2 of the sensing transistor have the same voltage value (i.e., the charging voltage Vbat). The sensing resistor 16b converts the sensing current Is flowing through the sensing transistor 14 into a sensing voltage Vs. A positive input terminal of the operational amplifier 16c is coupled between the voltage level controller 16a and the sensing resistor 16b, and a negative input terminal of the operational amplifier 16c receives a reference voltage Vref. The output terminal of the operational amplifier 16c generates the control signal Vg according to the sensing voltage Vs and the reference voltage Vref, thereby controlling the turned-on and turned-off states of the charging transistor 12 and the sensing transistor 14.

As shown in FIG. 1, a control terminal A1 of the charging transistor 12 is coupled to a control terminal B1, and the end A2 of the charging transistor 12 has a voltage value (i.e., a voltage value of the charging voltage Vbat) that is the same as the voltage value of the end B2 of the sensing transistor 14. Therefore, the charging current Ich flowing through the charging transistor 12 has a proportional relationship with the sensing current Is flowing through the sensing transistor 14, and the proportional relationship mentioned above is determined according to a size ratio between the charging transistor 12 and the sensing transistor 14.

In the constant current charging mode under ideal conditions, the battery voltage gradually rises with time, and the charging current Ich is a constant current. However, non-ideal characteristics of the electronic components (e. g. transistors) will cause inaccurate turned-on voltage of the transistor (threshold voltage), so that the charging current Ich changes as time increases. For example, FIG. 2 is a diagram showing a relationship between the existing system voltage, battery voltage and charging current. The voltage of the system terminal Vsys is 3.65V and the battery voltage is increased from 3V to 3.58V. During 1.3 seconds (s) to 1.5 seconds, the charging current Ich may cause an error amount of, for example, 33% due to inaccuracy of the turned-on voltage. From the current ratio RAO between the charging current Ich and the sensing current Is (shown in FIG. 3), the current ratio RAO =charging current Ich/sensing current Is. Therefore, during 0 seconds to 1.3 seconds, the current ratio RAO is 21k or close to 21k, which represents that a ratio of the charging current Ich to the sensing current Is is a constant value. However, during 1.3 seconds to 1.5 seconds, the current ratio RAO is significantly reduced as the time increases, representing that the error ratio of the charging current Ich and the sensing current Is is increased.

Therefore, in the constant current charging mode, if the ratio of the charging current Ich to the sensing current Is can be maintained at a constant value or close to the constant value, the charging current Ich can be maintained at a constant current value as time increases, thereby accurately controlling the charging current Ich.

SUMMARY OF THE DISCLOSURE

One object of the present disclosure is to provide a battery charging circuit for stabilizing a current value of a charging current in a constant current charging mode.

Embodiments of the present disclosure provide a battery charging circuit for operating in a constant current charging mode. The battery charging circuit includes a charging transistor, a first transistor, a second transistor, a first sensor and a second sensor. The charging transistor is coupled to a battery module and is configured to generate a charging current flowing through the charging transistor to charge the battery module. The first transistor is coupled to the charging transistor. A size of the first transistor is smaller than a size of the charging transistor. A bulk of the first transistor is connected in series with a bulk of the charging transistor through a voltage regulator. The second transistor is coupled to the charging transistor. The size of the second transistor is smaller than the size of the charging transistor and is different from the size of the first transistor. The bulk of the second transistor is connected in series with the bulk of the charging transistor. The first sensor is coupled to the charging transistor and the first transistor. The first sensor generates, according to a battery voltage of the battery module, a first voltage corresponding to the charging current, and controls turned-on and turned-off states of the charging transistor, the first transistor and the second transistor according to the first voltage and a reference voltage. The second sensor is coupled with a charging transistor, a second transistor and a first sensor. The second sensor generates a second voltage corresponding to the charging current according to a second current flowing through the second transistor, and generates, according to the first voltage and the second voltage, a bulk voltage to apply to a bulk of the second transistor and a bulk of the charging transistor. The voltage regulator adjusts a voltage proportional relationship between a turned-on voltage of the charging transistor and a turned-on voltage of the first transistor to stabilize a current value of the charging current.

In sum, embodiments of the present disclosure provides a battery charging circuit, which adjusts a voltage proportional relationship between the threshold voltage of a charging transistor and the threshold voltage of a first transistor according to a first voltage corresponding to a charging current and a second voltage corresponding to the charging current, so that the ratio between the charging current and a first current sensing the charging current is a fixed value or close to the fixed value. Thus, in the constant current charging mode, with the increase of time, the charging current can maintain the constant current value in order to overcome issues related to non- ideal characteristics of the electronic components leading to inaccurate threshold voltage of the transistor.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
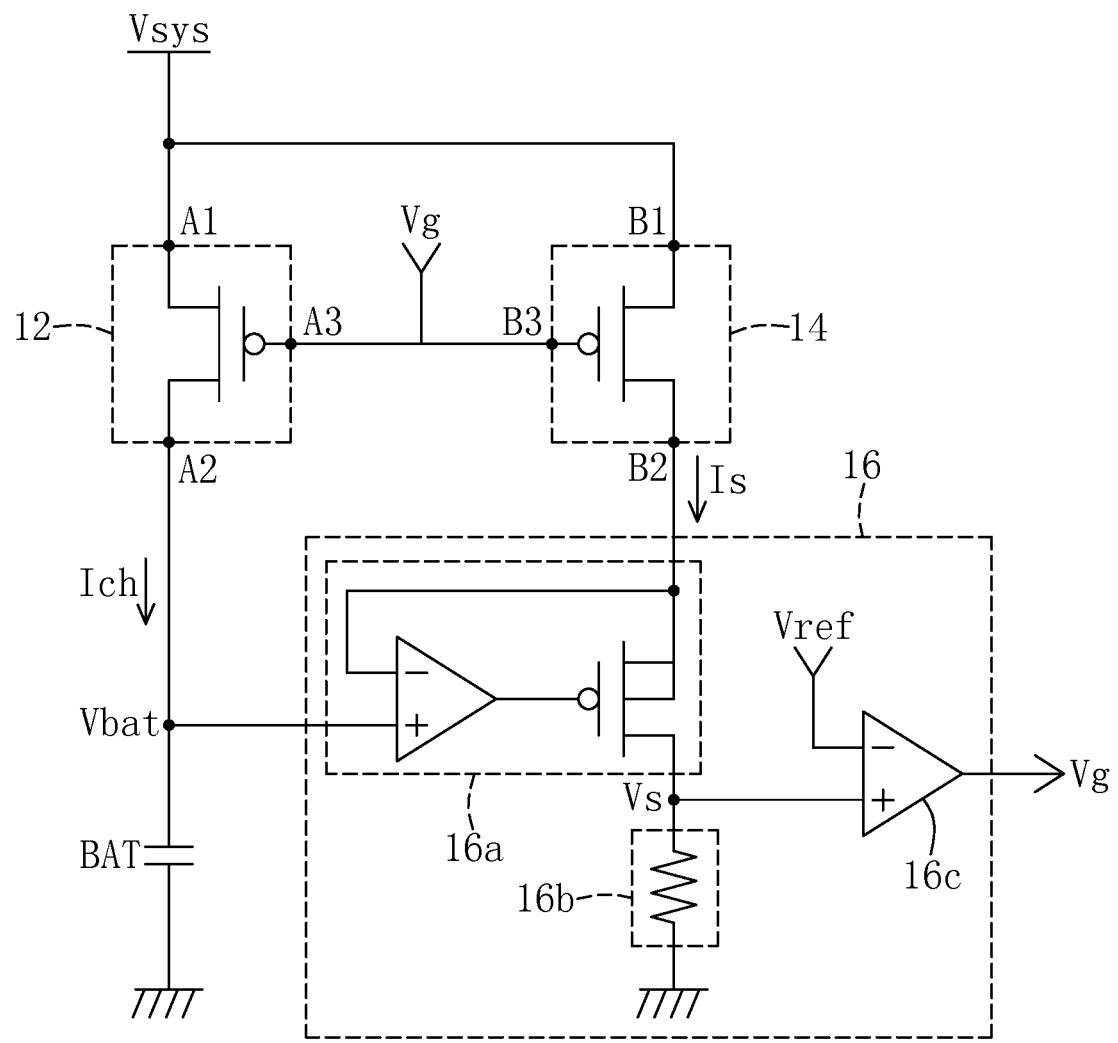
FIG. 1 is a schematic diagram of an existing battery charging circuit.
Figure 2:
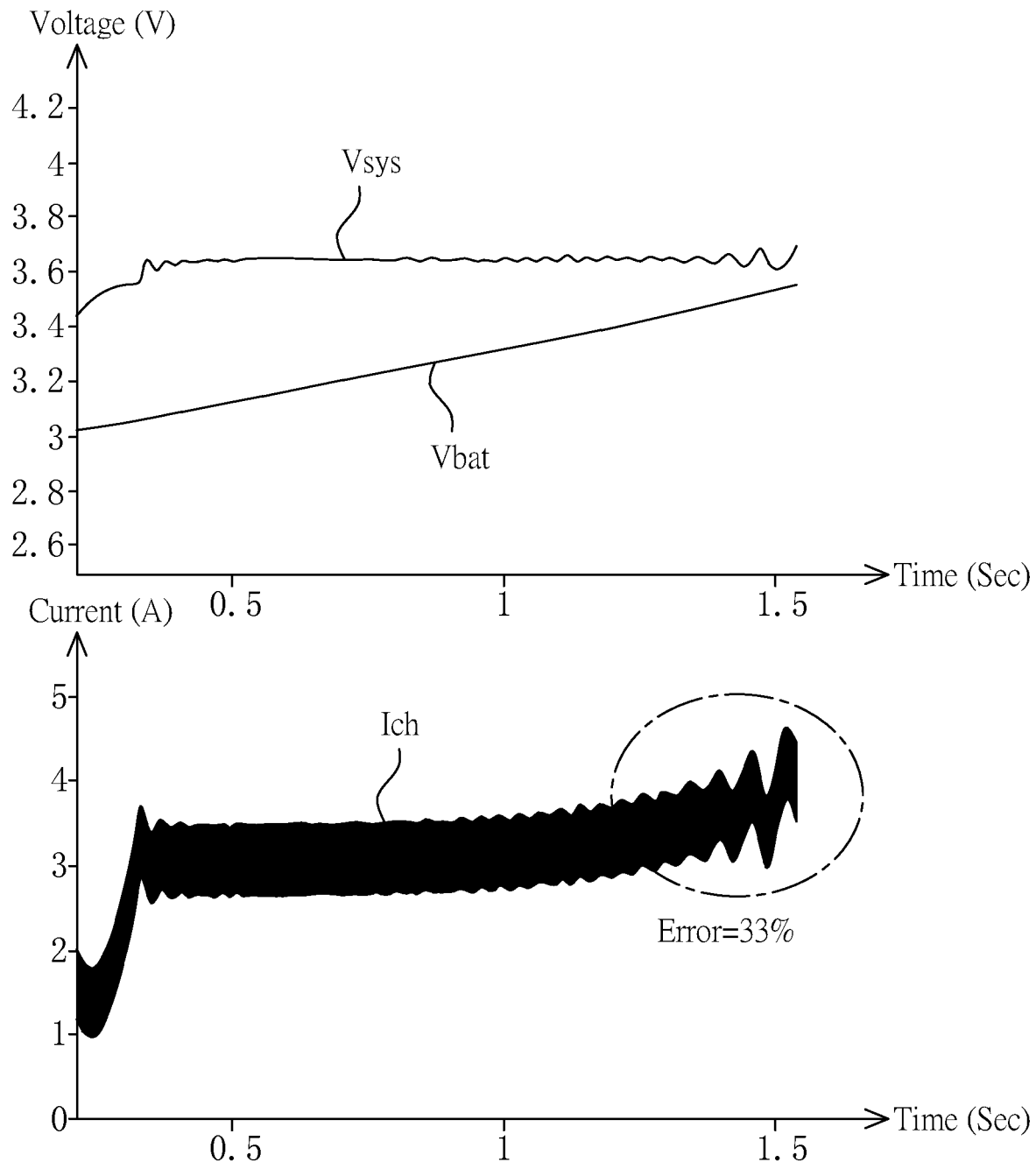
FIG. 2 is a diagram showing a relationship between the existing system voltage, battery voltage and charging current.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In the following, the present disclosure will be described in detail by way of illustration of various exemplary embodiments of the present disclosure. However, the concept of the present disclosure may be expressed in many different forms, and should not be construed as limited to the exemplary embodiments described in the context. In addition, the same reference numerals can be used to represent similar components in the accompany drawings.

It should be understood that the terms "first", "second", and the like, are used herein to describe various elements or signals that are used to distinguish one element from another, to distinguish one terminal of the same element from another, or distinguish a signal from another signal. It should be understood that these components, terminals or signals should not be limited by these terms. The technical concept of the present disclosure should be interpreted with reference to the detailed description and drawings herein.

Figure 4A:
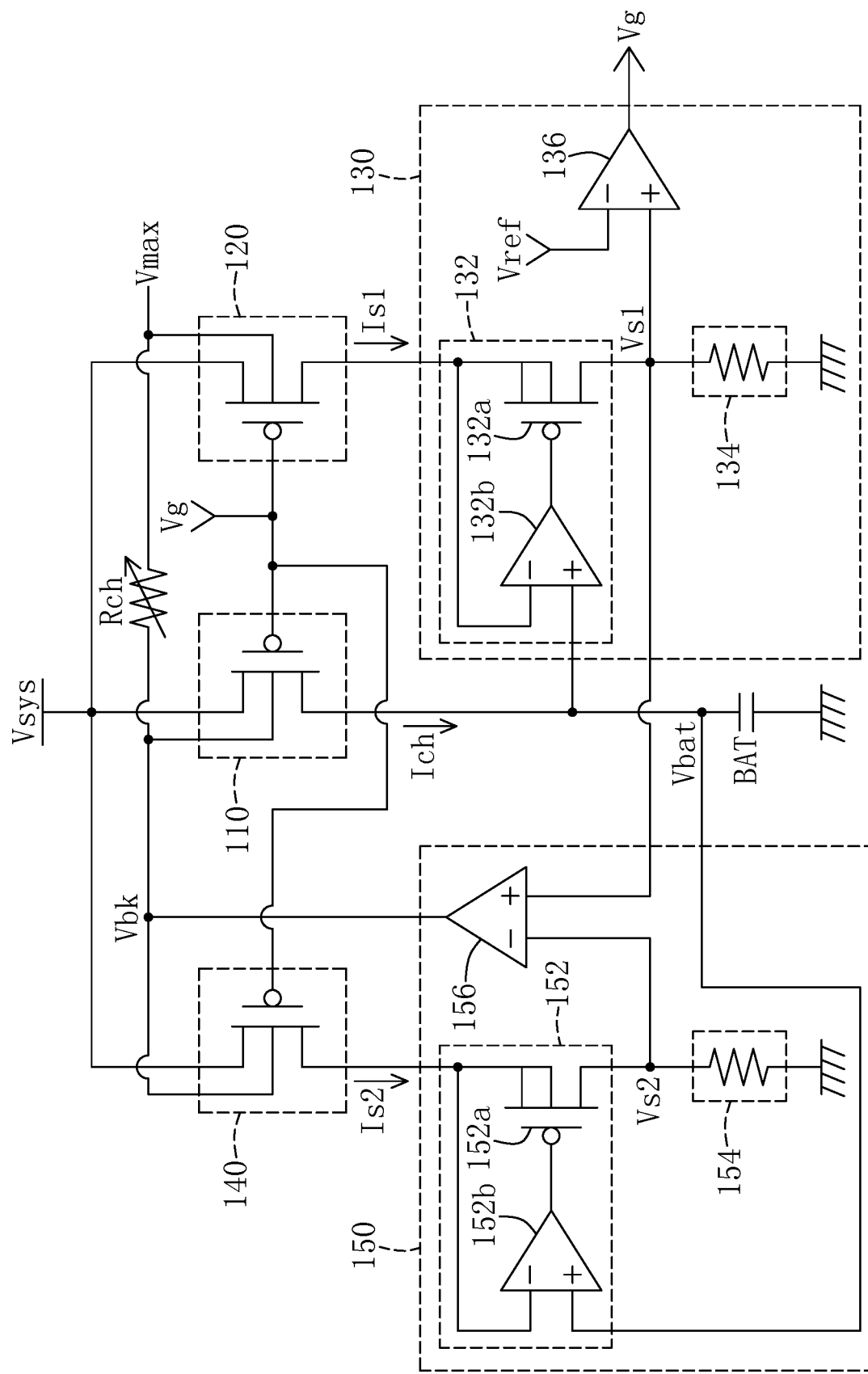
FIG. 4A is a schematic view of a battery charging circuit of an embodiment of the present disclosure.

Firstly, reference is made to FIG. 4A, which shows a schematic view of a battery charging circuit of an embodiment of the present disclosure. As shown in FIG. 4A, the battery charging circuit is coupled between a system terminal Vsys and a charging terminal Vbat. The system terminal Vsys has a system voltage generated by a power supply. The charging terminal Vbat has a battery voltage generated by the battery module BAT. The battery charging circuit includes a charging transistor 110, a first transistor 120, a first sensor 130, a second transistor 140 and a second sensor 150. The charging transistor 110 is coupled between the system terminal Vsys and the charging terminal Vbat, and is controlled by the control signal Vg to generate a charging current Ich flowing through the charging transistor 110 to charge the battery module BAT. The first transistor 120 is coupled to the charging transistor 110, and is controlled by the control signal Vg to generate a first current Isl flowing through the first transistor 120. The second transistor 140 is coupled to the charging transistor 110, and is controlled by the control signal Vg to generate a second current Is2 flowing through the second transistor 140.

In this embodiment, the charging transistor 110, the first transistor 120 and the second transistor 140 are P-type transistors with different sizes, respectively. One end of the charging transistor 110 (i.e., a source) is connected to the system terminal Vsys and another end (i.e. a drain) is connected to the charging terminal Vbat. One end of the first transistor 120 (i.e. a drain) is connected to the first sensor 130 and another end (i.e. a source) is connected to the system terminal Vsys. One end of the second transistor 140 (i.e. a source) is connected to the system terminal Vsys and another end (i.e. a drain) is connected to the second sensor 150. A control terminal (i.e. a gate) of the charging transistor 110, a control terminal (i.e. a gate) of the first transistor 120 and a control terminal (i.e. a gate) of the second transistor 140 are connected to each other. In other embodiments, the charging transistor 110, the first transistor 120 and the second transistor 140 may also be other types of transistors, and these different types of transistors may be connected according to the actual situation, and the present disclosure is not limited thereto.

In addition, in practical design, the size of the first transistor 120 is smaller than the size of the charging transistor 110. The size of the second transistor 140 is smaller than the size of the charging transistor 110 and differs from the size of the first transistor 120, so that the first current Isl flowing through the first transistor 120 has a current proportional relationship with the second current Is2 flowing through the second transistor 140. For example, the size ratio of the charging transistor 110, the first transistor 120 and the second transistor 140 is 20000:1:10.

A bulk of the first transistor 120 is connected in series with a bulk of the charging transistor 110 through a voltage regulator Rch, and a bulk of the second transistor 140 is connected in series with the bulk of the charging transistor 110. Accordingly, the first sensor 130 and the second sensor 150 can adjust a voltage proportional relationship between a turned-on voltage of the charging transistor 110 and a turned-on voltage of the first transistor 120 according to the following instructions.

The first sensor 130 is used to sense the battery voltage of the charging terminal Vbat, thereby controlling the turned-on and turned-off states of the charging transistor 110, the first transistor 120 and the second transistor 140. The first sensor 130 is coupled to the charging terminal Vbat, the first transistor 120 and the second sensor 150. The first sensor 130 generates a first voltage Vs1 corresponding to the charging current Ich based on the battery voltage of the battery module BAT, and controls turned-on and turned-off states of the charging transistor 110, the first transistor 120 and the second transistor 140 according to the first voltage Vs1 and a reference voltage Vref Further, the first sensor 130 includes a voltage level controller 132, a first resistor 134 and a first amplifier 136. The voltage level controller 132 is coupled to the charging terminal Vbat and the first transistor 120, so that the charging terminal Vbat and one end of the first transistor 120 (a drain in the present embodiment) have the same voltage value (that is, a voltage value of the charging terminal Vbat). The voltage level controller 132 will receive the battery voltage, and control the first current Is 1 flowing through the first transistor 120 to be proportional to the charging current Ich. The first resistor 134 is coupled to the voltage level controller 132 and generates a first voltage Vs1 corresponding to the charging current Ich according to the first current Is1.

In this embodiment, the voltage level controller 132 includes a first voltage switch 132a and a first voltage amplifier 132b. The first voltage switch 132a is coupled between the first transistor 120 and the first resistor 134. The first voltage switch 132a of the present embodiment is a P-type transistor. The first voltage switch 132a has one end (i.e. a source) connecting to a drain of the first transistor and the other end (i.e. the drain) connecting to the first resistor 134. A control terminal of the first voltage switch 132a (i.e. a gate) is connected to the first voltage amplifier 132b. In other embodiments, the first voltage switch 132a may also be other types of transistors, and these different types of transistors may be connected according to the actual situation, and the present disclosure is not limited thereto.

A positive input terminal of the first voltage amplifier 132b is coupled to the charging terminal Vbat. A negative input terminal of the first voltage amplifier 132b is coupled to the first voltage switch 132a and the drain of the first transistor 120. An output terminal of the first voltage amplifier 132b is coupled to the control terminal of the first voltage switch 132a, thereby controlling turned-on and turned-off states of the first voltage switch 132a, so that the drain of the first transistor has the same battery voltage as the charging terminal Vbat.

The first amplifier 136 has a positive input terminal and a negative input terminal. The positive input terminal of the first amplifier 136 receives the first voltage Vs1. The negative input terminal of the first amplifier 136 receives the reference voltage Vref. The first amplifier 136 generates a control signal Vg according to the first voltage Vs1 and the reference voltage Vref to control the turned-on and turned-off states of the charging transistor 110, the first transistor 120 and the second transistor 140.

Further, when the reference voltage Vref is greater than the first voltage Vs1, it indicates that the charging current of the battery module BAT is insufficient. At this time, the first amplifier 136 will generate, for example, a low level control signal Vg, thereby turning on the charging transistor 110 (generating the charging current Ich to charge the battery module BAT), the first transistor 120 (generating the first current Isl corresponding to the charging current) and the second transistor 140 (generating the second current Is2 corresponding to the charging current). When the reference voltage Vref is less than the first voltage Vs1, it indicates that the charging current of the battery module BAT is over the desired value. At this time, the first amplifier 136 will generate, for example, a high level control signal Vg, thereby turning off the charging transistor 110, the first transistor 120, and the second transistor 140.

The second sensor 150 is used for sensing a battery voltage of the charging terminal Vbat, thereby adjusting a voltage proportional relationship between the turned-on voltage of the charging transistor 110 and the turned-on voltage of the first transistor 120. The second sensor 150 is coupled to the charging terminal Vbat, the second transistor 140 and the first sensor 130. The second sensor 150 generates a second voltage Vs2 corresponding to the charging current Ich according to the battery voltage of the battery module BAT, and generates, according to the first voltage Vs1 and the second voltage Vs2, a bulk voltage VBK to apply to the bulk of the second transistor 140 and the bulk of the charging transistor 110. Further, the second sensor 150 includes a second voltage level controller 152, a second resistor 154 and a second amplifier 156. The second voltage level controller 152 is coupled to the charging terminal Vbat and the second transistor 140, so that the charging terminal Vbat and one end of the second transistor 140 (a drain in the present embodiment) have the same voltage value (that is, a voltage value of the charging terminal Vbat). The second voltage level controller 152 will receive the battery voltage, and control the second current Is2 flowing through the second transistor 140 to be proportional to the charging current Ich. The second resistor 154 is coupled to the second voltage level controller 152 and generates a second voltage Vs2 corresponding to the charging current Ich according to the second current Is2.

In this embodiment, the second voltage level controller 152 includes a second voltage switch 152a and a second voltage amplifier 152b. The second voltage switch 152a is coupled between the second transistor 140 and the second resistor 154. The second voltage switch 152a of the present embodiment is a P-type transistor. The second voltage switch 152a has one end (i.e. a source) connecting to a drain of the second transistor 140 and the other end (i.e. the drain) connecting to the second resistor 154. A control terminal of the second voltage switch 152a (i.e. a gate) is connected to the second voltage amplifier 152b. In other embodiments, the second voltage switch 152a may also be other types of transistors, and these different types of transistors may be connected according to the actual situation, and the present disclosure is not limited thereto.

A positive input terminal of the second voltage amplifier 152b is coupled to the charging terminal Vbat. A negative input terminal of the second voltage amplifier 152b is coupled to the second voltage switch 152a and one end of the second transistor 140. An output terminal of the second voltage amplifier 152b is coupled to the control terminal of the second voltage switch 152a, thereby controlling turned-on and turned-off states of the second voltage switch 152a, so that the one end of the second transistor has the same battery voltage as the charging terminal Vbat.

It should be noted that the first voltage Vs1 and the second voltage Vs2 are both generated according to the battery voltage, and thus the first voltage Vs1 and the second voltage Vs2 should theoretically have the same voltage values. The first resistor 134 and the second resistor 154 has a resistance proportional relationship, so that the first current Is1 flowing through the first transistor 120 and the second current Is2 flowing through the second transistor 140 also have a current proportional relationship. For example, the resistance value of the first resistor 134 is 10 times the resistance value of the second resistor 154 (i.e., the resistance ratio is 10:1), and the size value of the first transistor 120 is 1/10 times the size value of the second transistor 140 (i.e., the scale value ratio is 1:10). Therefore, the current value of the first current Is1 should theoretically be 1/10 times the current value of the second current Is2 (i.e., the current ratio is 1: 10), so as to maintain the first voltage Vs1 and the second voltage Vs2 at the same voltage values.

However, non-ideal characteristics of the electronic components (e. g. transistors) will cause inaccurate turned-on voltage of the transistors mentioned above during the process of fabrication, which may cause the first voltage Vs1 and the second voltage Vs2 to have errors in practice. Therefore, the battery charging circuit will utilize the second amplifier 156 to adjust the turned-on voltages of the charging transistor 110, the first transistor 120 and the second transistor 140, thereby maintaining the voltage proportional relationship between the turned-on voltages of the charging transistor 110 and the first transistor 120, such that the charging current Ich can be maintained at a constant current value as time increases. The detailed structure and embodiment of the second amplifier 156 are described as follows.

The second amplifier 156 has a positive input terminal and a negative input terminal. A positive input terminal of the second amplifier 156 receives the first voltage Vs1, and a negative input terminal of the second amplifier 156 receives the second voltage Vs2. The second amplifier 156 will generate, according to the first voltage Vs1 and the second voltage Vs2, a bulk voltage Vbk to apply to the bulk of the second transistor 140 and the bulk of the charging transistor 110, to make the bulk of the charging transistor 110 and the bulk of the second transistor 140 have the same voltage values.

At this time, the voltage regulator Rch will adjust the voltage proportional relationship between the turned-on voltage of the charging transistor 110 and the turned-on voltage of the first transistor 120 according to the bulk voltage Vbk, so as to maintain the first voltage Vs1 and the second voltage Vs2 at the same voltage value, thereby stabilizing the current value of the charging current Ich. Further, the voltage regulator Rch adjusts the difference between the voltage value of the bulk of the charging transistor 110 and the voltage value of the bulk of the first transistor 120 to maintain the voltage proportional relationship between the turned-on voltages of the charging transistor 110 and the first transistor 120. In this embodiment, the voltage regulator Rch can be a variable resistor, can be a combination of a variable current source and a resistor, or can be other voltage adjusting element that can adjust the voltage proportional relationship mentioned above based on the bulk voltage Vbk, and the present disclosure is not limited thereto.

Figure 5:
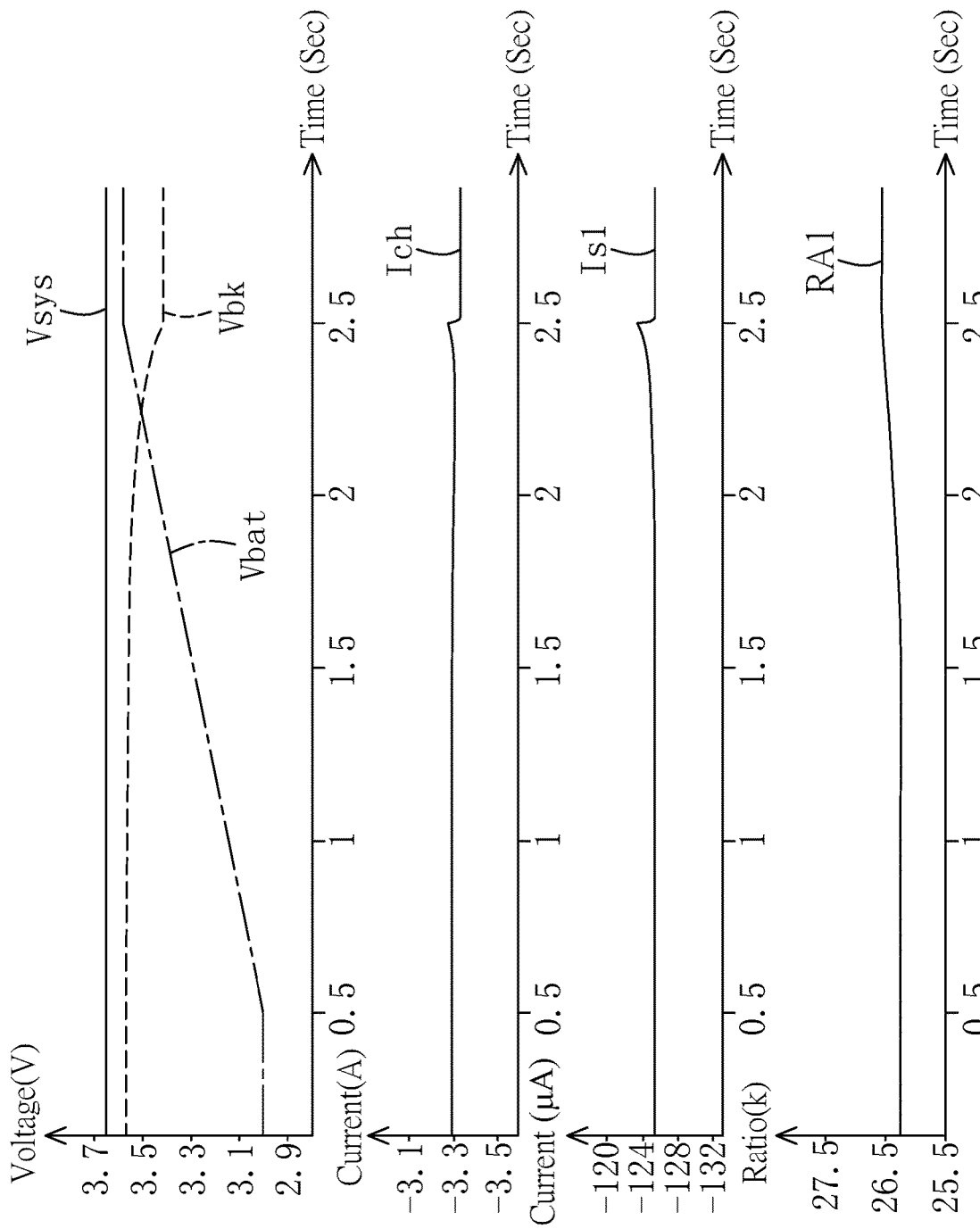
FIG. 5 is a diagram showing a relationship between current proportions of the charging current and the sensing current of an embodiment of the present disclosure.

After the voltage regulator Rch adjusts the above-mentioned voltage proportional relationship, the current ratio RA1 (equals to charging current Ich / sensing current Is) between the charging current Ich and the sensing current Is1 is shown in FIG. 5. In the constant current charging mode, the charging current Ich flowing through the charging transistor 110 and the first current Is1 flowing through the first transistor 120 is maintained at a constant current value as time increases, so that the current ratio RA1 between the charging current Ich and the first current Is1 is 26.5k or close to 26.5k (representing that the ratio of the charging current Ich to the sensing current Is is a constant value or close to a constant value).

Figure 3:
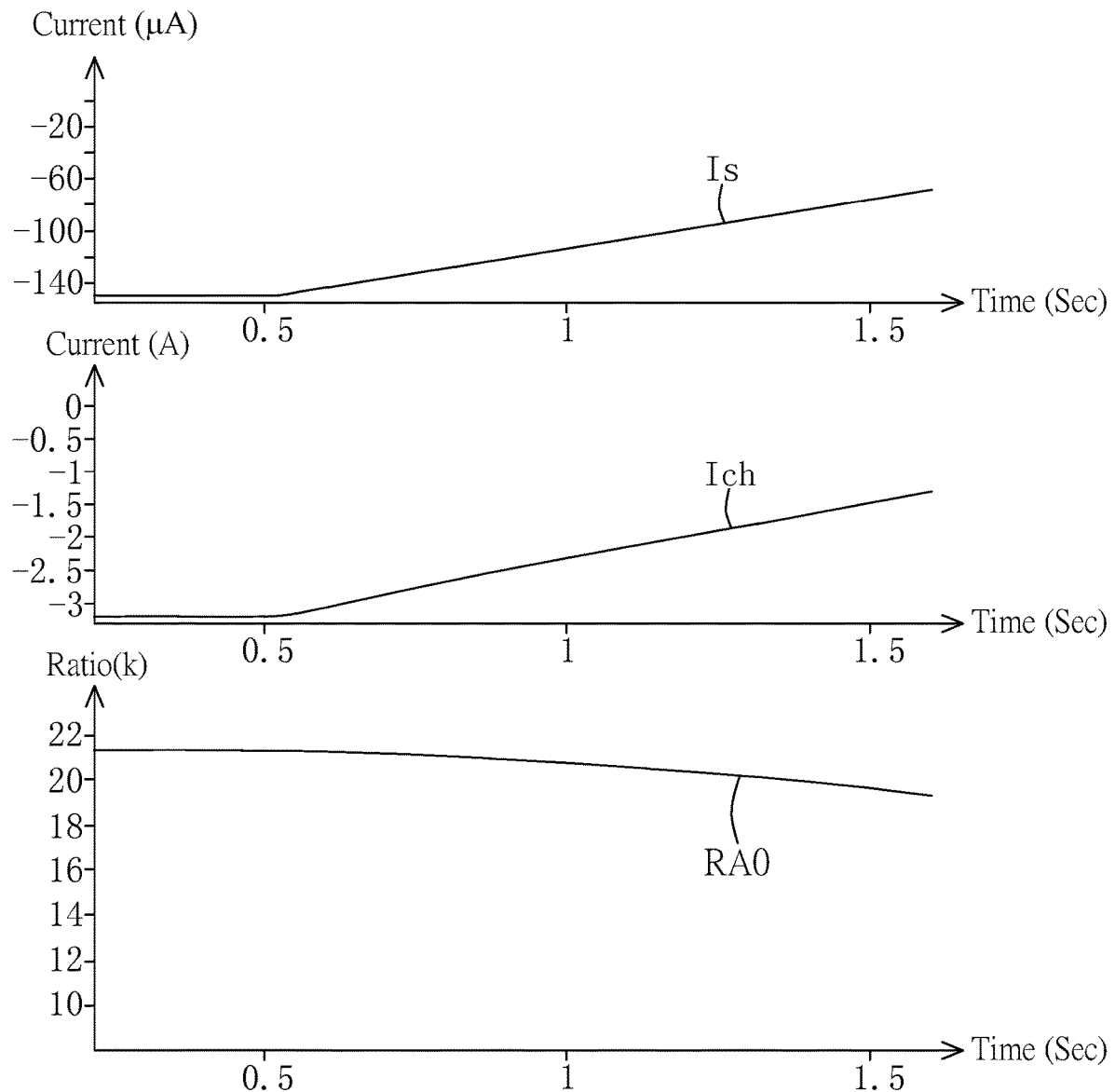
FIG. 3 is a graph showing a relationship between the existing current ratios of the charging current and the sensing current.

Compared to the existing current ratio RA0 between the charging current Ich and sensing current Is shown in FIG. 3, the current ratio RA1 between the charging current Ich and the first current Is1 of the present disclosure shown in FIG. 5 is maintained at 26.5k or close to 26.5k as time increases, such that the ratio of the charging current Ich to the first current Is1 is a constant value or close to a constant value. Thus, in the constant current charging mode, the charging current Ich can be maintained at a constant current value as time increases, so as to overcome the issues that the non-ideal characteristics of the electronic components (such as transistors) lead to inaccurate turned-on voltages of the charging transistor 110, the first transistor 120 and the second transistor 140.

Figure 4B:
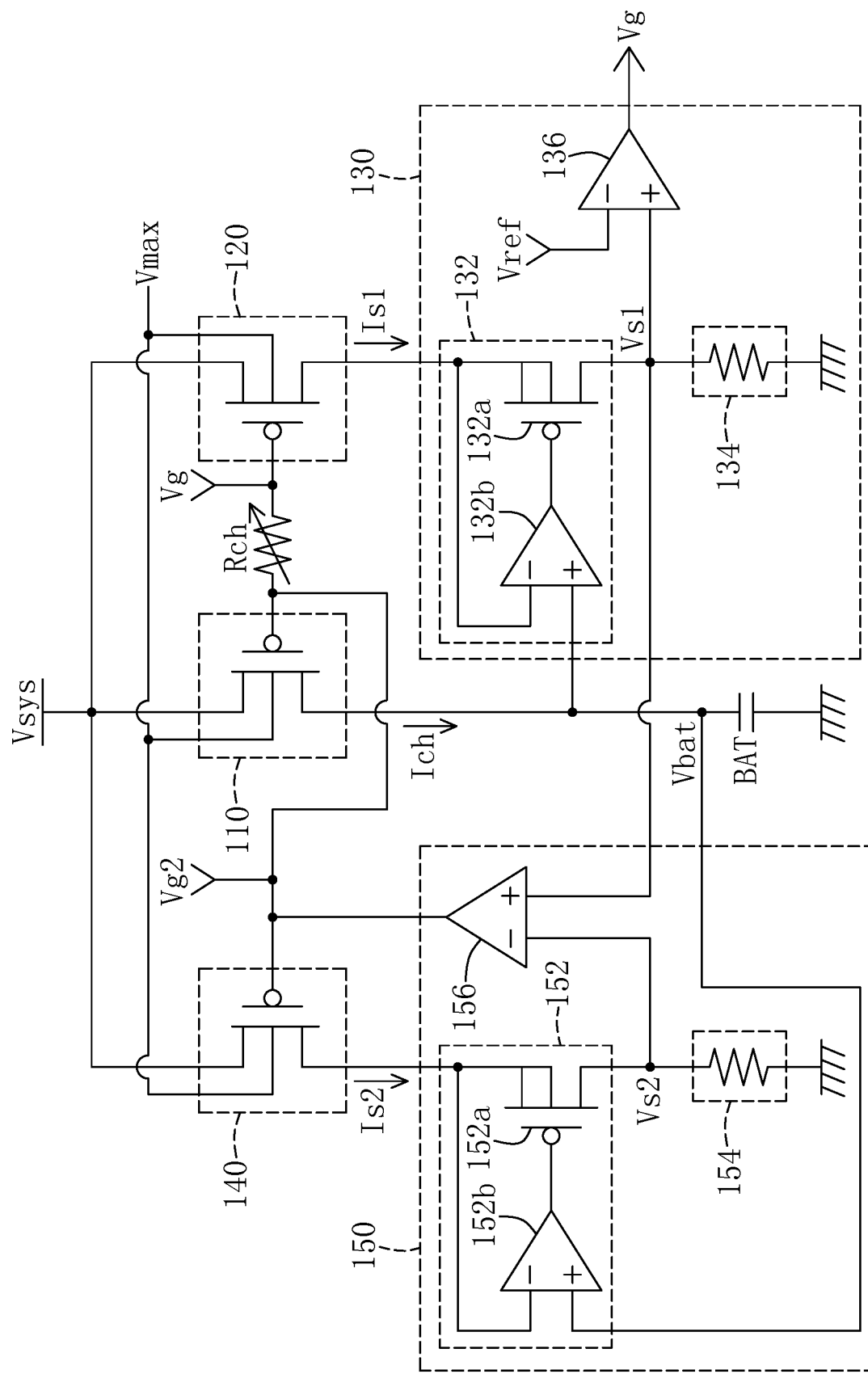
FIG. 4B is a schematic view of a battery charging circuit of another embodiment of the present disclosure.

Reference is now made to FIG. 4B, which is a schematic view of a battery charging circuit of another embodiment of the present disclosure. The embodiment shown in FIG. 4B differs from the embodiment shown in FIG. 4A in that the output terminal of the second amplifier 156 as shown in FIG. 4B is connected to the control terminal (gate) of the second transistor 140. The control terminal (gate) of the second transistor 140 receives a gate control voltage Vg2. The control terminal (gate) of the charging transistor 110 and the control terminal (gate) of the first transistor 120 are connected to the voltage regulator Rch. The gate voltage of the charging transistor 110 and the gate voltage of the first transistor 120 are adjusted through the voltage regulator Rch, such that turned-on control voltages of the charging transistor 110 and the first transistor 120 can be different.

Figure 4C:
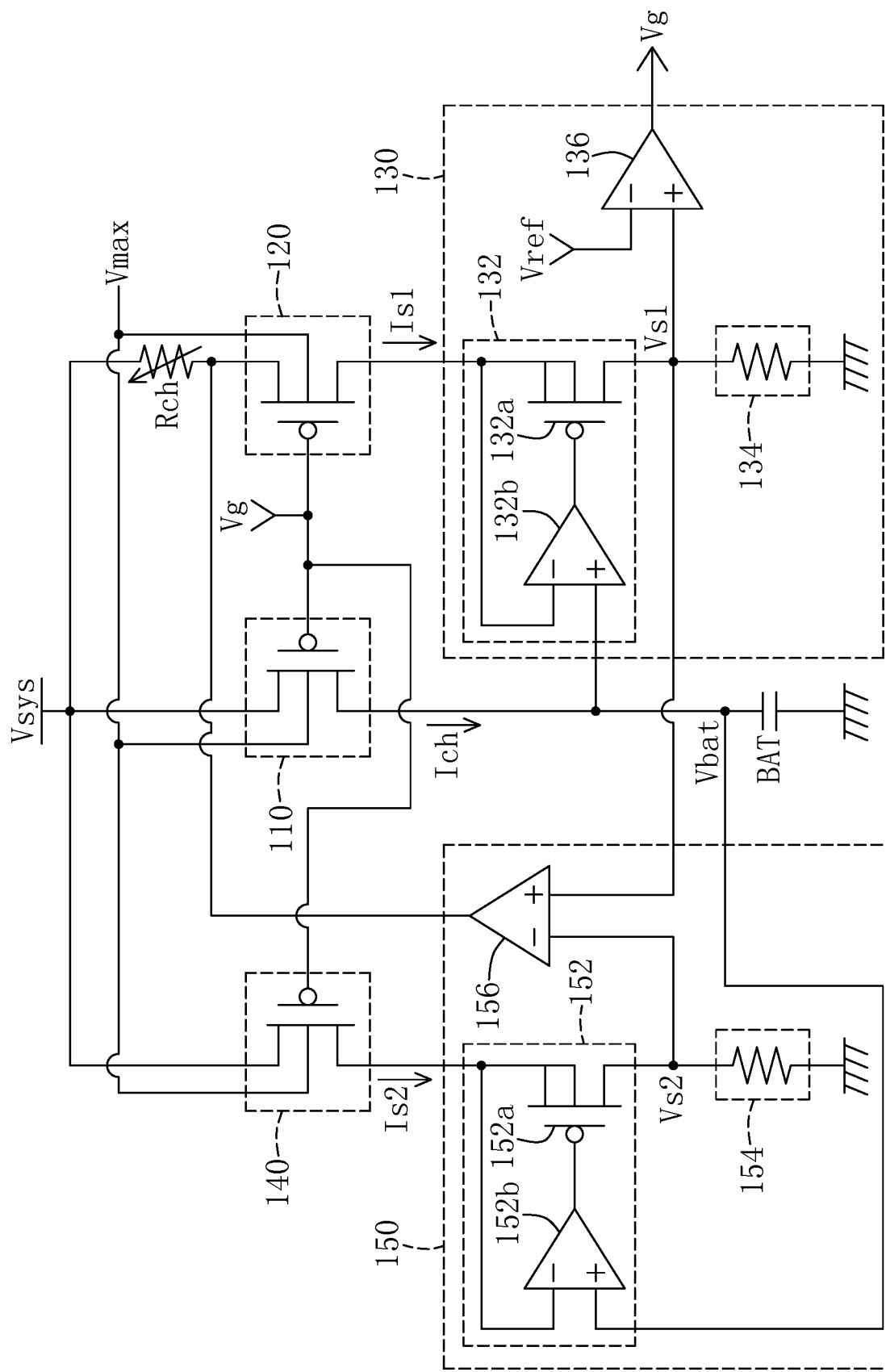
FIG. 4C is a schematic diagram of a battery charging circuit of yet another embodiment of the present disclosure.

Reference is now made to FIG. 4C, which is a schematic diagram of a battery charging circuit of yet another embodiment of the present disclosure. The embodiment shown in FIG. 4C differs from the embodiment shown in FIG. 4A in that the output terminal of the second amplifier 156 as shown in FIG. 4C is connected to one end (source) of the first transistor 120. One end (source) of the first transistor 120 is connected to the voltage regulator Rch, and the voltage regulator Rch is connected to the system terminal Vsys. The source voltage of the first transistor 120 can be controlled by the voltage regulator Rch, including controlling a voltage level supplied to the first transistor 120 from the system terminal Vsys.

In sum, the battery charging circuit provided by the present disclosure can stabilize the current value of the charging current in the constant current charging mode.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A battery charging circuit operated in a constant current charging mode, comprising:
   a charging transistor coupled to a battery module and configured to generate a charging current flowing through the charging transistor to charge the battery module;
   a first transistor coupled to the charging transistor and generating a first current flowing through the first transistor, wherein a size of the first transistor is smaller than a size of the charging transistor, and a bulk of the first transistor is connected in series with a bulk of the charging transistor through a voltage regulator;
   a second transistor coupled to the charging transistor and generating a second current flowing through the second transistor, wherein a size of the second transistor is smaller than the size of the charging transistor and different from the size of the first transistor, and a bulk of the second transistor is connected in series with the bulk of the charging transistor;
   a first sensor coupled to the first transistor and a charging terminal between the charging transistor and the battery module, configured to generate, according to a battery voltage of the battery module, a first voltage corresponding to the charging current, and control turned-on and turned-off states of the charging transistor, the first transistor and the second transistor according to the first voltage and a reference voltage; and
   a second sensor coupled to the charging terminal, the second transistor and the first sensor, configured to generate, according to the battery voltage of the battery module, a second voltage corresponding to the charging current, and generate, according to the first voltage and the second voltage, a bulk voltage to apply on the bulk of the second transistor and the bulk of the charging transistor;
   wherein the voltage regulator adjusts a voltage proportional relationship between a turned-on voltage of the charging transistor and a turned-on voltage of the first transistor to stabilize a current value of the charging current.

2. The battery charging circuit according to claim 1, wherein the first current has a current proportional relationship with the second current.

3. The battery charging circuit according to claim 1, wherein the first sensor includes:
   a first voltage level controller coupled to the charging terminal and the first transistor, configured to receive the battery voltage and control the first current flowing through the first transistor to be proportional to the charging current;
   a first resistor coupled to the first voltage level controller, configured to generate the first voltage according to the first current; and
   a first amplifier having a positive input terminal and a negative input terminal, wherein the positive input terminal receives the first voltage, the negative input terminal receives the reference voltage, and the first amplifier is configured to generate, according to the first voltage and the reference voltage, a control signal to control the turned-on and turned-off states of the charging transistor, the first transistor and the second transistor.

4. The battery charging circuit according to claim 3, wherein the first voltage level controller includes:
   a first voltage switch coupled between the first transistor and the first resistor; and
   a first voltage amplifier having a positive input terminal coupled to the charging terminal and a negative input terminal coupled one end of the first transistor between the first voltage switch and the first transistor, and having a output terminal coupled to a control terminal of the first voltage switch, making the one end of the first transistor have the same battery voltage as the charging terminal.

5. The battery charging circuit according to claim 1, wherein the second sensor includes:
   a second voltage level controller coupled to the charging terminal and the second transistor, configured to receive the battery voltage, and control the second current flowing through the second transistor to be proportional to the charging current;

a second resistor coupled to the second voltage level controller, configured to generate the second voltage according to the second current;

a second amplifier having a positive input terminal receiving the first voltage and a negative input terminal receiving the second voltage, and configured to generate, according to the first voltage and the second voltage, the bulk voltage to apply on the bulk of the second transistor and the bulk of the charging transistor.

6. The battery charging circuit according to claim 5, wherein the second voltage level controller includes:

a second voltage switch coupled between the second transistor and the second resistor; and a second voltage amplifier having a positive input terminal coupled to the charging terminal and a negative input terminal coupled to a second end between the second voltage switch and the second transistor, and having a output terminal coupled to a control terminal of the second voltage switch, to make the second end have the same battery voltage as the charging terminal.

7. The battery charging circuit according to claim 3, wherein the second sensor includes:

a second voltage level controller coupled to the second transistor and a charging terminal between the charging transistor and the battery module, configured to receive a battery voltage of the battery module, and to control, according to the battery voltage, the second current to be proportional to the charging current;

a second resistor coupled to the second voltage level controller, configured to generate the second voltage according to the second current;

a second amplifier having a positive input terminal receiving the first voltage and a negative input terminal receiving the second voltage, and configured to generate, according to the first voltage and the second voltage, the bulk voltage to apply on the bulk of the second transistor and the bulk of the charging transistor.

8. The battery charging circuit according to claim 7, wherein the first resistor has a resistance proportional relationship with the second resistor, and the first transistor has a size proportional relationship with the second transistor.

9. The battery charging circuit according to claim 1, wherein the voltage regulator is a variable resistor.

10. The battery charging circuit according to claim 1, wherein the voltage regulator adjusts a voltage value of the bulk of the charging transistor and a voltage value of the bulk of the first transistor, to maintain the voltage proportional relationship between the turned-on voltage of the charging transistor and the turned-on voltage of the first transistor.

* * * * *